(12) United States Patent
Campbell et al.

(10) Patent No.: US 10,926,485 B2
(45) Date of Patent: *Feb. 23, 2021

(54) LIGHT GENERATING MICROCAPSULES FOR PHOTO-CURING

(71) Applicant: International Business Machines Corporation, Armonk, NY (US)

(72) Inventors: Eric J. Campbell, Rochester, MN (US); Sarah K. Czaplewski-Campbell, Rochester, MN (US); Joseph Kuczynski, North Port, FL (US); Timothy J. Tofil, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/441,853

(22) Filed: Jun. 14, 2019

(65) Prior Publication Data

US 2019/0291357 A1    Sep. 26, 2019

Related U.S. Application Data

(63) Continuation of application No. 15/603,686, filed on May 24, 2017, now Pat. No. 10,357,921.

(51) Int. Cl.
*B29C 65/00* (2006.01)
*C08G 59/18* (2006.01)
(Continued)

(52) U.S. Cl.
CPC .......... *B29C 66/73113* (2013.01); *C08F 2/48* (2013.01); *C08G 59/188* (2013.01);
(Continued)

(58) Field of Classification Search
CPC ... B29C 66/73113; C08F 2/48; C08G 59/188; C08G 59/68; C08J 3/126; C09J 5/02;
(Continued)

(56) References Cited

U.S. PATENT DOCUMENTS

| 3,481,790 A | 12/1969 | Duddy |
| 3,653,372 A | 4/1972 | Douglas |

(Continued)

FOREIGN PATENT DOCUMENTS

| CA | 918331 A | 1/1973 |
| CN | 103740978 A | 4/2014 |

(Continued)

OTHER PUBLICATIONS

Caruso et al. "Robust, Double-Walled Microcapsules for Self-Healing Polymeric Materials," ACS Applied Materials & Interfaces, 2010, vol. 2, No. 4, pp. 1195-1199.
(Continued)

*Primary Examiner* — Daniel McNally
(74) *Attorney, Agent, or Firm* — Michael D. Purdham

(57) ABSTRACT

A process of curing a photo-curable material includes dispersing a microcapsule in a material that includes a photo-initiator and a photo-curable material. The process also includes applying a stimulus to the microcapsule to trigger a chemiluminescent reaction within the microcapsule. The chemiluminescent reaction generating a photon having a wavelength within a particular emission range that is consistent with an absorption range of the photo-initiator. The photon exits the microcapsule to trigger the photo-initiator to initiate or catalyze curing of the photo-curable material.

20 Claims, 5 Drawing Sheets

(51) Int. Cl.

| | | |
|---|---|---|
| *C08G 59/68* | (2006.01) | |
| *C09K 11/07* | (2006.01) | |
| *C09K 11/02* | (2006.01) | |
| *C08F 2/48* | (2006.01) | |
| *F16B 11/00* | (2006.01) | |
| *H01L 23/00* | (2006.01) | |
| *C08J 3/12* | (2006.01) | |
| *C09J 5/02* | (2006.01) | |

(52) U.S. Cl.
CPC .............. *C08G 59/68* (2013.01); *C08J 3/126* (2013.01); *C09J 5/02* (2013.01); *C09K 11/025* (2013.01); *C09K 11/07* (2013.01); *F16B 11/006* (2013.01); *H01L 24/00* (2013.01); *C08J 2325/18* (2013.01); *C08J 2339/00* (2013.01); *C08J 2389/06* (2013.01); *C09K 2211/1007* (2013.01); *C09K 2211/1011* (2013.01); *C09K 2211/1014* (2013.01)

(58) Field of Classification Search
CPC ..... C09K 11/025; C09K 11/07; F16B 11/006; H01L 24/00
See application file for complete search history.

(56) References Cited

U.S. PATENT DOCUMENTS

| | | | |
|---|---|---|---|
| 3,656,372 A | 4/1972 | Chana | |
| 3,689,391 A | 9/1972 | Ullman | |
| 4,095,583 A | 6/1978 | Petersen | |
| 4,233,402 A | 11/1980 | Maggio et al. | |
| 4,273,671 A | 6/1981 | Allinikov | |
| 4,278,837 A | 7/1981 | Best | |
| 4,598,274 A | 7/1986 | Holmes | |
| 4,635,166 A | 1/1987 | Cameron | |
| 4,772,530 A | 9/1988 | Gottschalk | |
| 4,811,288 A | 3/1989 | Kleijne | |
| 4,814,949 A | 3/1989 | Elliott | |
| 4,816,367 A | 3/1989 | Sakojiri | |
| 5,169,707 A | 12/1992 | Faykish | |
| 5,319,475 A | 6/1994 | Kay | |
| 5,325,721 A | 7/1994 | Pendergrass, Jr. | |
| 5,406,630 A | 4/1995 | Piosenka | |
| 5,508,893 A | 4/1996 | Nowak | |
| 5,904,795 A | 5/1999 | Murakami et al. | |
| 5,904,796 A | 5/1999 | Freuler | |
| 5,945,995 A | 8/1999 | Higuchi et al. | |
| 5,984,995 A | 11/1999 | White | |
| 6,114,413 A | 9/2000 | Kang | |
| 6,217,213 B1 | 4/2001 | Curry | |
| 6,235,148 B1 | 5/2001 | Courson, Jr. | |
| 6,530,527 B1 | 3/2003 | Ahlers | |
| 6,758,572 B2 | 7/2004 | Ladyjensky | |
| 6,776,495 B2 | 8/2004 | Nomiyama | |
| 6,833,191 B2 | 12/2004 | Bayless | |
| 6,876,143 B2 | 4/2005 | Daniels | |
| 6,947,285 B2 | 9/2005 | Chen | |
| 7,005,733 B2 | 2/2006 | Kömmerling | |
| 7,065,656 B2 | 6/2006 | Schwenck | |
| 7,223,964 B2 | 5/2007 | Wiese | |
| 7,247,791 B2 | 7/2007 | Kulpa | |
| 7,248,359 B2 | 7/2007 | Boege | |
| 7,274,791 B2 | 9/2007 | van Enk | |
| 7,290,549 B2 | 11/2007 | Banerjee | |
| 7,296,299 B2 | 11/2007 | Schwenck | |
| 7,362,248 B2 | 4/2008 | McClure | |
| 7,385,491 B2 | 6/2008 | Doi | |
| 7,436,316 B2 | 10/2008 | Fleischman | |
| 7,443,176 B2 | 10/2008 | McClure | |
| 7,488,954 B2 | 2/2009 | Ross | |
| 7,518,507 B2 | 4/2009 | Dalzell | |
| 7,540,621 B2 | 6/2009 | Goychrach | |
| 7,573,301 B2 | 8/2009 | Walmsley | |
| 7,666,813 B2 | 2/2010 | Hoefer et al. | |
| 7,806,072 B2 | 10/2010 | Hamilton, II | |
| 7,816,785 B2 | 10/2010 | Iruvanti | |
| 7,830,021 B1 | 11/2010 | Wilcoxon | |
| 7,834,442 B2 | 11/2010 | Furman | |
| 7,886,813 B2 | 2/2011 | Hua | |
| 7,889,442 B2 | 2/2011 | Suzuki et al. | |
| 7,952,478 B2 | 5/2011 | Bartley | |
| 8,137,597 B1 | 3/2012 | Brott | |
| 8,174,112 B1 | 5/2012 | Karp | |
| 8,198,641 B2 | 6/2012 | Zachariasse | |
| 8,288,857 B2 | 10/2012 | Das | |
| 8,310,147 B2 | 11/2012 | Seo | |
| 8,502,396 B2 | 8/2013 | Buer | |
| 8,522,049 B1 | 8/2013 | Ahmadi | |
| 8,581,209 B2 | 11/2013 | Oxley | |
| 8,623,418 B2 | 1/2014 | Liang | |
| 8,647,579 B2 | 2/2014 | La Grone | |
| 8,659,908 B2 | 2/2014 | Adams | |
| 8,741,084 B2 | 6/2014 | Kisch et al. | |
| 8,741,804 B2 | 6/2014 | Boday | |
| 8,824,040 B1 | 9/2014 | Buchheit | |
| 8,865,285 B2 | 10/2014 | Dagher | |
| 8,896,100 B2 | 11/2014 | Kishino et al. | |
| 8,896,110 B2 | 11/2014 | Hu | |
| 9,040,252 B2 | 5/2015 | Della Ciana | |
| 9,075,018 B2 | 7/2015 | Geddes | |
| 9,217,736 B2 | 12/2015 | Ribi | |
| 9,245,202 B2 | 1/2016 | Boday | |
| 9,307,692 B2 | 4/2016 | Boday | |
| 9,856,404 B2 | 1/2018 | Campbell | |
| 9,858,780 B1 | 1/2018 | Campbell | |
| 9,896,389 B2 | 2/2018 | Campbell | |
| 10,040,993 B1 | 8/2018 | Brott | |
| 10,215,648 B1 | 2/2019 | Pillars et al. | |
| 10,229,292 B2 | 3/2019 | Campbell | |
| 10,318,462 B2 | 6/2019 | Bartley | |
| 10,331,911 B2 | 6/2019 | Kuczynski | |
| 10,357,921 B2* | 7/2019 | Campbell | .............. C08F 2/48 |
| 10,392,452 B2 | 8/2019 | Campbell et al. | |
| 10,508,204 B2 | 12/2019 | Odarczenko | |
| 10,513,735 B2 | 12/2019 | Swartz et al. | |
| 2005/0068760 A1 | 3/2005 | Goychrach | |
| 2006/0079021 A1 | 4/2006 | Yang | |
| 2006/0228542 A1 | 10/2006 | Czubarow | |
| 2007/0054762 A1 | 3/2007 | Tocco | |
| 2007/0207284 A1 | 9/2007 | McClintic | |
| 2008/0038540 A1 | 2/2008 | Hirayama | |
| 2008/0090942 A1 | 4/2008 | Hovorka | |
| 2008/0277596 A1 | 11/2008 | Oxley | |
| 2008/0286856 A1 | 11/2008 | Park | |
| 2009/0036568 A1 | 2/2009 | Merle | |
| 2009/0155571 A1 | 6/2009 | Mustonen | |
| 2010/0006431 A1 | 1/2010 | Wallace | |
| 2012/0077279 A1 | 3/2012 | Wiesner | |
| 2013/0034739 A1 | 2/2013 | Boday | |
| 2013/0179996 A1 | 7/2013 | Boday | |
| 2014/0011049 A1 | 1/2014 | Stamm | |
| 2014/0110049 A1 | 4/2014 | Yuen | |
| 2014/0110469 A1 | 4/2014 | Wang et al. | |
| 2014/0368992 A1 | 12/2014 | Strader | |
| 2015/0038809 A1 | 2/2015 | Etzkorn | |
| 2015/0166822 A1 | 6/2015 | Samsudin | |
| 2015/0246521 A1 | 9/2015 | Fathi | |
| 2015/0364710 A1 | 12/2015 | Chen | |
| 2016/0033497 A1 | 2/2016 | Wang | |
| 2016/0053169 A1 | 2/2016 | Kunath | |
| 2016/0067524 A1 | 3/2016 | Bourke, Jr. | |
| 2016/0289484 A1 | 10/2016 | Lalgudi | |
| 2017/0015886 A1 | 1/2017 | Braun et al. | |
| 2017/0027197 A1 | 2/2017 | Bourke, Jr. | |
| 2017/0029532 A1 | 2/2017 | Pandya | |
| 2017/0129825 A1 | 5/2017 | Campbell | |
| 2017/0130102 A1 | 5/2017 | Campbell | |
| 2017/0130993 A1 | 5/2017 | Campbell | |
| 2017/0158886 A1 | 6/2017 | Odarczenko | |
| 2017/0279532 A1 | 9/2017 | Bartley | |
| 2018/0116060 A1 | 4/2018 | Campbell | |
| 2018/0158305 A1 | 6/2018 | Noland et al. | |
| 2018/0327659 A1 | 11/2018 | Campbell | |

(56) References Cited

U.S. PATENT DOCUMENTS

| | | | |
|---|---|---|---|
| 2018/0340032 | A1 | 11/2018 | Campbell |
| 2018/0340850 | A1 | 11/2018 | Campbell |
| 2018/0371122 | A1 | 12/2018 | Campbell |
| 2018/0371123 | A1 | 12/2018 | Campbell |
| 2019/0291357 | A1 | 9/2019 | Campbell et al. |
| 2019/0309105 | A1 | 10/2019 | Campbell et al. |

FOREIGN PATENT DOCUMENTS

| | | | | |
|---|---|---|---|---|
| CN | 103740997 | B | 4/2016 | |
| JP | 2000317578 | A | 11/2000 | |
| JP | 2001176924 | A | 6/2001 | |
| JP | 4073571 | B2 | 4/2008 | |
| WO | 9733922 | W | 9/1997 | |
| WO | WO-9733922 | A1 * | 9/1997 | ............ A61K 6/90 |
| WO | 2009029804 | A2 | 3/2009 | |
| WO | 2011086018 | A1 | 7/2011 | |
| WO | 2013041871 | A2 | 3/2013 | |
| WO | 2014204828 | A2 | 12/2014 | |
| WO | 2016186336 | A1 | 11/2016 | |

OTHER PUBLICATIONS

Delcea et al., Multicompartmental Micro- and Nanocapsules: Hierarchy and Applications in Biosciences, Macromolecular Bioscience, vol. 10, May 2010, pp. 465-474, Wiley-VCH Verlag GmbH & Co., Weinheim.

E. N. Brown et al., "In situ poly(urea-formaldehyde) microencapsulation of dicyclopentadiene," Journal of Microencapsulation, vol. 20, No. 6, pp. 719-730, 2003.

Hu et al., Controlled Rupture of Magnetic Polyelectrolyte Microcapsules for Drug Delivery, Langmuir, vol. 24, Sep. 2008, pp. 11811-11818, American Chemical Society, USA.

Jorgensen et al., A Biochemical Microdevice With An Integrated Chemiluminescence Detector, Sensors And Actuators B: Chemical, vol. 90, Issue 1, Apr. 2003, pp. 15-21, Elsevier, Amsterdam, Netherlands.

Kawashita et al., In vitro heat generation by ferrimagnetic maghemite microspheres for hyperthermic treatment of cancer under alternating magnetic field, Journal of Materials Science: Materials in Medicine, vol. 19, Issue 5, pp. 1897-1903, May 2008, (Abstract Only, 2 pages), URL: www.ncbi.nlm.nih.gov/pubmed/17914614.

Keller et al., Mechanical Properties of Microcapsules Used in a Self-Healing Polymer, Experimental Mechanics, vol. 46, Nov. 2006, pp. 725-733, Society for Experimental Mechanics, Bethel, CT.

Kreft et al., "Shell-in-Shell Microcapsules: A Novel Tool for Integrated, Spatially Confined Enzymatic Reactions", Angewandte Chemie, Int. Ed., Jul. 2007 (online Jun. 2007), vol. 46, Issue 29, pp. 5605-5608, Wiley-VCH Verlag GmbH & Co., KGaA, Weinheim, DOI: 10.1002/anie.200701173.

Lee, Microencapsulated Heat Generating Material to Accelerate the Curing Process During Liquid Crystal Display Fabrication, NineSigma, Inc. (online), 2014 (month unknown), 3 pages, accessed Jun. 5, 2017, URL: https://ninesights.ninesigma.com/rfps/-/rfp-portlet/rfpViewer/2690.

List of IBM Patents or Patent Applications Treated as Related, Jun. 14, 2019, 2 pages.

Marzzacco, C., "The Effect of a Change in the Catalyst on the Enthalpy of Decomposition of Hydrogen Peroxide," pp. 12-13, Chem 13 News/Nov. 2008, reprinted from pp. 16-17, May, 2001.

Masin, The Chemistry of Hand Warmers, 3 pages, chemistryislife. com (online), accessed Jun. 5, 2017, URL: www.chemistryislife.com/the-chemistry- of-hand-warmer.

Parakhonskiy, Colloidal micro- and nano-particles as templates for polyelectrolyte multilayer capsules, Advances in Colloid and Interface Science, May 2014, vol. 207, pp. 253-264, ScienceDirect.com (online), Elsevier B.V., Amsterdam.

Park et al., Smart Microplates: Integrated Photodiodes For Detecting Bead-Based Chemiluminescent Reactions, 5th IEEE Conference on Sensors, EXCO, (IEEE Sensors 2006), held Oct. 2006, Daegu, Korea, pp. 580-583, Institute of Electrical and Electronics Engineers (IEEE), DOI: 10.1109/ICSENS.2007.355534, USA.

Previte et al., Microwave-Triggered Metal-Enhanced Chemiluminescence (MT-MEC): Application to Ultra-Fast and Ultra-Sensitive Clinical Assays, Journal Of Fluorescence, vol. 16, Issue 5, Sep. 2006, pp. 641-647, Springer Science+Business Media, Berlin, Germany.

Stober et al., Controlled Growth of Monodisperse Silica Spheres in the Micron Size Range, Journal of Colloid and Interface Science, vol. 26, Jan. 1968, pp. 62-69, Elsevier Inc., Amsterdam.

U.S. Appl. No. 16/441,948, to Eric J. Campbell et al., entitled, "Light Generating Microcapsules for Self-Healing Polymer Applications", assigned to International Business Machines Corporation, 22 pages, filed Jun. 14, 2019.

Unknown, Advanced Technologies for LCD Assembly, DowCorning.com (online), 2014 (month unknown), 4 pages, accessed Jun. 5, 2017, URL: www.dowcorning.com/content/publishedlit/11-3437_Advanced_Technologies_LCD_Assembly.pdf?wt.svl=ELEC_LHH.

Unknown, Flameless Chemical Heaters, zenstoves.net (online), 4 pages, accessed Jun. 5, 2017, URL: http://zenstoves.net/Flameless.htm.

Unknown, Flameless Ration Heater (FRH), MREInfo.com (online), 2014, 5 pages, accessed Jun. 5, 2017, URL: www.mreinfo.com/us/mre/frh.html.

Unknown, Loctite Eccobond DS 6601, Henkel.com (online), Mar. 2013, 2 pages, URL: https://tds.us.henkel.com/NA/UT/HNAUTTDS.nsf/web/C0DD8377AB27D63985257B41005DC4A1/$File/LOCTITE%20ECCOBOND%20DS%206601-EN.pdf.

Unknown, Materials for Sealing Liquid Crystal, Three Bond Technical News, vol. 43, May 1994, pp. 1-8, Three Bond Europe, UK.

Unknown, PTFE Coatings, Specific Heat of Some Common Substances, engineeringtoolbox.com (online), 7 pages, accessed Jun. 5, 2017, URL: www.engineeringtoolbox.com/specific-heat-capacity-d_391.html.

Unknown, Standard enthalpy change of formation (data table), Wikipedia.org (online), 13 pages, accessed Jun. 5, 2017, URL: en.wikipedia.org/wiki/Standard_enthalpy_change_of_formation_%28data_table%29.

Unknown, Technical Overview: Microencapsulation, microteklabs.com (online), 4 pages, accessed Jun. 5, 2017, URL: www.microteklabs.com/technical_overview.pdf.

Unknown, Thermochemistry, 7 pages, Olomouc-Hejčín Gymnasium (online), 7 pages, accessed Jun. 5, 2017, URL: http://smd.gytool.cz/downloads/thermochemistry_bar.pdf.

Xiong et al., "Towards Theranostic Multicompartment Microcapsules: in-situ Diagnostics and Laser-induced Treatment", Theranostics, vol. 3, Issue 3, Feb. 2013, pp. 141-151, Ivyspring International, Sydney, Australia.

Yamaura et al., "Preparation and characterization of (3-aminopropyl) triethoxysilane-coated magnetite nanoparticles", Journal of Magnetism and Magnetic Materials, vol. 279, Issues 2-3, Aug. 2004, pp. 210-217, ScienceDirect.com (online), Elsevier B.V., Amsterdam.

Zhan et al., Electrochemical Sensing in Microfluidic Systems Using Electrogenerated Chemiluminescence As A Photonic Reporter Of Redox Reactions, JACS Articles, vol. 124, No. 44, Oct. 2002, pp. 13265-13270, American Chemical Society, Washington, D.C.

Engineering ToolBox, (2003). Specific Heat of some common Substances. [online] Available at: https://www.engineeringtoolbox.com/specific-heat-capacity-d_391.html [Accessed Jan. 9, 2020].

List of IBM Patents or Patent Applications Treated as Related, Jan. 16, 2020, 2 pages.

* cited by examiner

LIGHT GENERATING MICROCAPSULES FOR PHOTO-CURING

BACKGROUND

Some polymers and adhesives are capable of being cured via exposure to a light source, such as an ultraviolet (UV) light source. A disadvantage associated with such a curing method is that the UV radiation enters the polymer/adhesive from an outer surface. As such, full curing of the polymer/adhesive may occur at the surface, but curing may decrease along a depth of the polymer/adhesive as a result of absorption of the UV radiation, resulting in a partially cured polymer/adhesive. In order to fully cure the polymer/adhesive, other means are employed such as thermal curing.

SUMMARY

According to an embodiment, a process of curing a photo-curable material is disclosed. The process includes dispersing a microcapsule in a material that includes a photo-initiator and a photo-curable material. The process also includes applying a stimulus to the microcapsule to trigger a chemiluminescent reaction within the microcapsule. The chemiluminescent reaction generating a photon having a wavelength within a particular emission range that is consistent with an absorption range of the photo-initiator. The photon exits the microcapsule to trigger the photo-initiator to initiate or catalyze curing of the photo-curable material.

According to another embodiment, an in-situ photo-curing process is disclosed. The process includes forming an assembly that includes a material disposed between a first component and a second component. The material includes a photo-initiator, a photo-curable material, and microcapsules dispersed therein. The process also includes applying a stimulus to the assembly that triggers chemiluminescent reactions within the microcapsules. The chemiluminescent reactions generate photons having wavelengths within a particular emission range that is consistent with an absorption range of the photo-initiator. The photons exit the microcapsules for in-situ curing of the photo-curable material.

According to another embodiment, a material is disclosed that includes a photo-initiator, a photo-curable material, and a microcapsule. The microcapsule includes a first compartment that contains a first reactant. The microcapsule also includes a second compartment that contains a second reactant. The microcapsule also includes an isolating structure separating the first compartment from the second compartment and is adapted to rupture in response to application of a stimulus to cause the first reactant and the second reactant to undergo a chemiluminescent reaction. The chemiluminescent reaction generates a photon having a wavelength within a particular emission range that is consistent with an absorption range of the photo-initiator. The photon exits the microcapsule to trigger the photo-initiator to initiate or catalyze curing of the photo-curable material.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

In FIG. 1, an individual microcapsule is depicted in an exploded cross-sectional view prior to application of a stimulus to cause a chemiluminescent reaction with a photon emission wavelength that is satisfactory to trigger the photo-initiator to cross-link the polymeric material.

In FIG. 2, an individual microcapsule is depicted in an exploded cross-sectional view to show that a substantial portion of the photons generated within the microcapsule may be transmitted into the interface material in order to trigger the photo-initiator to cross-link the polymeric material.

FIG. 4 illustrates that application of the compressive force causes a chemiluminescent reaction with a photon emission wavelength that is satisfactory to form the cross-linked thermal interface material.

DETAILED DESCRIPTION

The present disclosure describes light generating microcapsules and processes of utilizing the light generating microcapsules for in-situ generation of light within a polymer/adhesive for curing/cross-linking of the polymer/adhesive. Chemiluminescence is the emission of photons as the result of a chemical reaction. In the present disclosure, a microcapsule includes multiple compartments to isolate a first reactant (or a first set of reactants) from a second reactant (or a second set of reactants) within the same microcapsule. Application of a particular stimulus (e.g., a compressive force, heat, or a combination thereof) to the microcapsule results in rupture of an inner compartment, enabling the first reactant(s) and the second reactant(s) to mix and undergo a chemiluminescent reaction within the microcapsule.

The microcapsules of the present disclosure may be dispersed within a polymer/adhesive (e.g., a thermal interface material) that includes a photo-initiator and photo-curable cross-linkers. An outer shell of the microcapsule may be formed from a material that enables a substantial portion of the light generated within the microcapsule to exit the microcapsule into the surrounding polymer/adhesive. The in-situ generation of light within the polymer/adhesive may trigger the photo-initiator to initiate or catalyze the curing of the photo-curable cross-linkers. Thus, in contrast to existing techniques of curing a polymer/adhesive by exposing an outer surface of the polymer/adhesive to a light source (e.g., a UV light source), the in-situ generation of light by the microcapsules of the present disclosure that are dispersed within the polymer/adhesive enable the polymer/adhesive to be fully cured without employing other means, such as thermal cycling.

As used herein, the term "light" is used to refer to ultraviolet (UV) light (in a wavelength range of 10 nm to 400 nm), visible light (e.g., in a wavelength range of 400 nm to 700 nm), or infrared light (e.g., above 700 nm) that may be produced as a result of a chemiluminescent reaction. As used herein, the term "microcapsule" is used to refer to capsules that are in a range of about 10 microns to 1000 microns in diameter. However, it will be appreciated that the following disclosure may be applied to capsules having a smaller size (also referred to as "nanocapsules").

Figure 1:
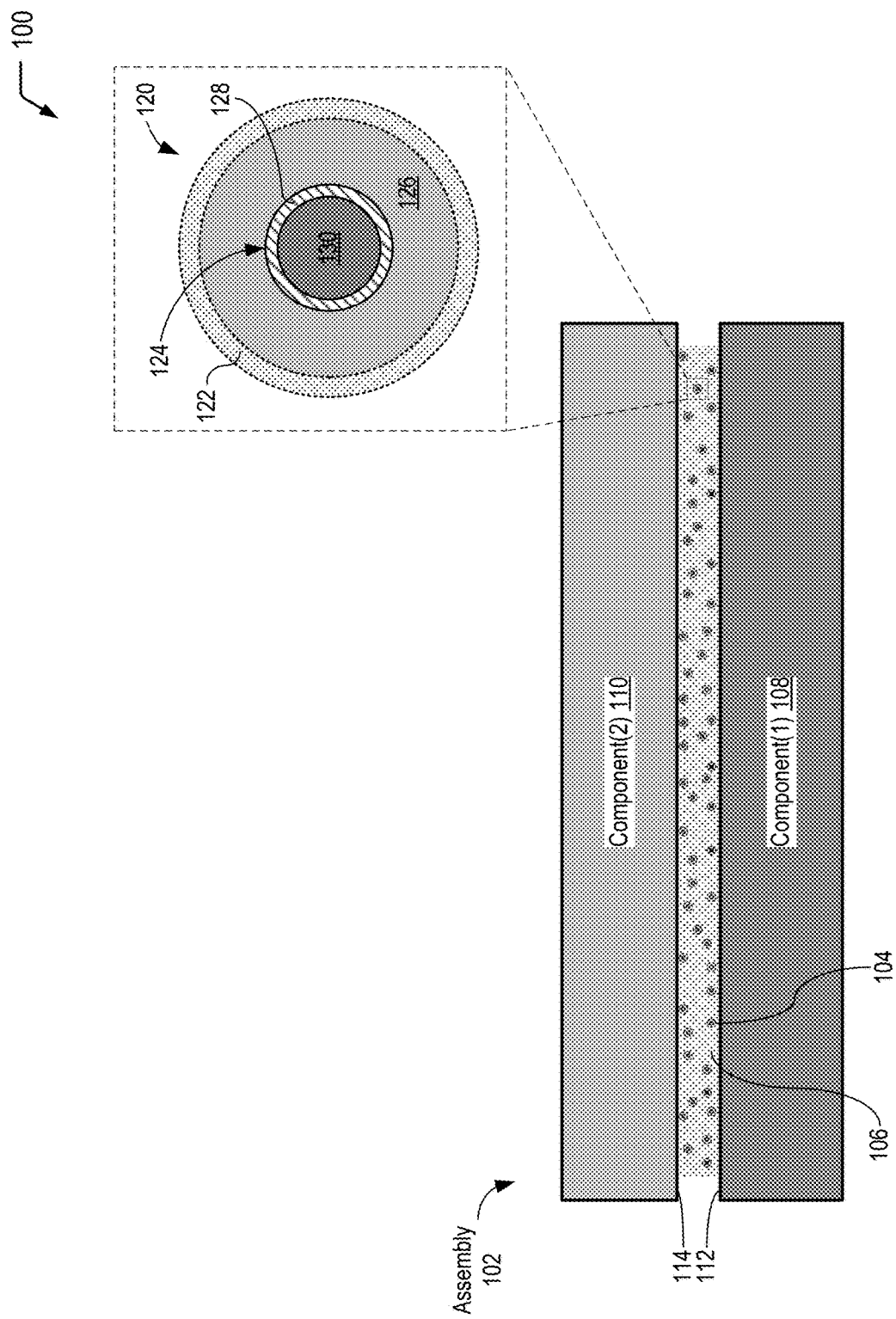
FIG. 1 is a diagram illustrating a cross-sectional view of an assembly that includes multiple-compartment microcapsules dispersed in an interface material that includes a photo-initiator and a polymeric material that is cross-linkable, according to one embodiment.

Referring to FIG. 1, a diagram 100 illustrates a cross-sectional view of a particular embodiment of an assembly 102 that includes a plurality of microcapsules 104 dispersed in an interface material 106. The microcapsules 104 illustrated in FIG. 1 include multiple compartments and are also referred to herein as multiple-compartment microcapsules or light generating microcapsules. In FIG. 1, the interface material 106 further includes a photo-initiator and a polymeric material having cross-linking moieties that are triggered using light (also referred to herein as "photo-curable cross-linkers"). In FIG. 1, the microcapsules 104 are shown prior to application of a particular stimulus (e.g., a compressive force, heat, or a combination thereof) that results in a chemiluminescent reaction within the individual microcapsules 104. Accordingly, FIG. 1 illustrates that the compartments of the microcapsules 104 enable isolation of reactants in order to prevent the chemiluminescent reaction prior to application of the particular stimulus.

FIG. 1 illustrates an example in which the interface material 106 defines an interface between a first component 108 and a second component 110. In a particular embodiment, the interface material 106 corresponds to a thermal interface material that is compressed between the first component 108 and the second component 110, filling gaps associated with irregularities in a first mating surface 112 of the first component 108 and a second mating surface 114 of the second component 110. In some cases, as illustrated and further described herein with respect to the example of FIG. 4, the first component 108 of FIG. 1 may correspond to a heat spreader surrounding an electronic component that generates heat during operation, the second component 110 may correspond to a heat dissipating component (e.g., a heat sink or cold plate), and the interface material 106 may enable efficient heat transfer from the first component 108 to the second component 110. In alternative embodiments, the microcapsules 104 depicted in FIG. 1 may be dispersed in a photo-curable adhesive.

The photo-curable material in the interface material 106 may correspond to an epoxy-based material, an acrylate-based material, or another type of photo-curable material that is "tuned" to the radiation resulting from a particular chemiluminescent reaction. A photo-curable material begins to cure as its photo-initiator is energized by radiation from a chemiluminescent light source. As an example, a photo-curable methacrylate material may be "tuned" to respond to different wavelengths of light depending on the particular photo-initiator that is used. As another example, a photo-curable epoxy material may be "tuned" to respond to different wavelengths of light depending on the particular photo-initiator that is used.

In the particular embodiment depicted in FIG. 1, the microcapsules 104 dispersed in the interface material 106 have a shell-in-shell architecture with an inner shell contained within an outer shell, where the inner shell is adapted to rupture in response to application of a stimulus (e.g., a compressive force and optionally heat) in order to trigger a chemiluminescent reaction within the microcapsules 104. Thus, the individual microcapsules 104 may correspond to the multiple-compartment microcapsule 300 depicted in FIG. 3A (having the shell-in-shell architecture). Alternatively, the individual microcapsules 104 of FIG. 1 may correspond to the multiple-compartment microcapsule 310 depicted in FIG. 3B. It will be appreciated that, in alternative embodiments, the microcapsules 104 of FIG. 1 may have an alternative multiple-compartment microcapsule design, may include more than one type of multiple-compartment microcapsule design, or a combination thereof.

FIG. 1 further includes an exploded cross-sectional view of an individual microcapsule 120 of the plurality of microcapsules 104 prior to application of a particular stimulus (e.g., a compressive force and optionally heat for the microcapsule design depicted in FIG. 1). The exploded cross-sectional view illustrates that the microcapsule 120 has an outer wall 122 (also referred to herein as the "outer shell") and contains an inner microcapsule 124 and a first reactant 126 (or a first set of multiple reactants). The inner microcapsule 124 has a capsule wall 128 (also referred to herein as the "inner shell") and contains a second reactant 130 (or a second set of multiple reactants). The first reactant(s) 126 within the microcapsule 120 may surround the inner microcapsule 124, and the first reactant(s) 126 may be prevented from contacting the second reactant(s) 130 by the capsule wall 128 of the inner microcapsule 124.

As illustrated and further described herein, subsequent application of a stimulus to the microcapsules 104 may result in rupture of the capsule wall 128 of the inner microcapsule 124, allowing the first reactant(s) 126 and the second reactant(s) 130 to mix and undergo a chemiluminescent reaction. As described further herein, an example of a chemiluminescent reaction is the reaction of a suitable dye with diphenyl oxalate and a suitable oxidant such as hydrogen peroxide to produce a photon-emitting reaction. To illustrate, in some cases, the first reactant(s) 126 may correspond to hydrogen peroxide, and the second reactant(s) 130 may correspond to a mixture of a dye and diphenyl oxalate. As illustrated and described further herein with respect to FIG. 4, a product of a chemical reaction between diphenyl oxalate and hydrogen peroxide is 1,2-dioxetane-dione that has an unstable strained ring, which decomposes spontaneously to carbon dioxide and releases energy that excites a dye, and the excited dye subsequently releases a photon as it returns to its ground state.

In the particular embodiment depicted in FIG. 1, the stimulus that is subsequently applied to the microcapsules 104 corresponds to a compressive force (and optionally heat). In this case, the capsule wall 128 of the inner microcapsule 124 may be formed to rupture under a particular compressive force, and the outer wall 122 of the microcapsule 120 may be formed so as to not rupture under that compressive force.

As described further herein, the chemiluminescent reaction generates actinic photons within a particular wavelength range that is satisfactory to trigger the particular photo-initiator to initiate or catalyze the curing of the photo-curable material in the interface material 106. The outer wall 122 of the microcapsule 120 allows a substantial portion of the actinic photons generated within the microcapsule 120 as a result of the chemiluminescent reaction to pass through the outer wall 122 into the surrounding interface material 106. The outer wall 122 can be made from chemically non-reactive materials, such as some plastics which are transparent, translucent, or light filtering to pass the curing wavelengths of light from chemiluminescent light source into the interface material 106. In an embodiment, the outer wall 122 has a transmittance value of at least 90% for the particular emitted photon wavelength(s). In certain embodiments, the outer wall 122 may include a natural polymeric material, such as gelatin, arabic gum, shellac, lac, starch, dextrin, wax, rosin, sodium alginate, zein, and the like; semi-synthetic polymer material, such as methyl cellulose, ethyl cellulose, carboxymethyl cellulose, hydroxyethyl ethyl cellulose; full-synthetic polymer material, such as polyolefins, polystyrenes, polyethers, polyureas, polyethylene glycol, polyamide, polyurethane, polyacrylate, epoxy resins, among others.

Thus, FIG. 1 illustrates an example of an assembly that includes light generating microcapsules dispersed in an interface material (e.g., a thermal interface material, an adhesive, etc.) that includes a photo-initiator and a photo-curable material. In FIG. 1, the microcapsules are shown prior to application of a stimulus to the microcapsules. Accordingly, the compartment(s) of the microcapsules isolate reactants that undergo a chemiluminescent reaction. As described further herein with respect to FIGS. 2 and 4, applying a stimulus (e.g., a compressive force and optionally heat) to the microcapsules results in rupture of the capsule wall of the inner microcapsule, allowing the reactants to mix and undergo the chemiluminescent reaction.

Figure 2:
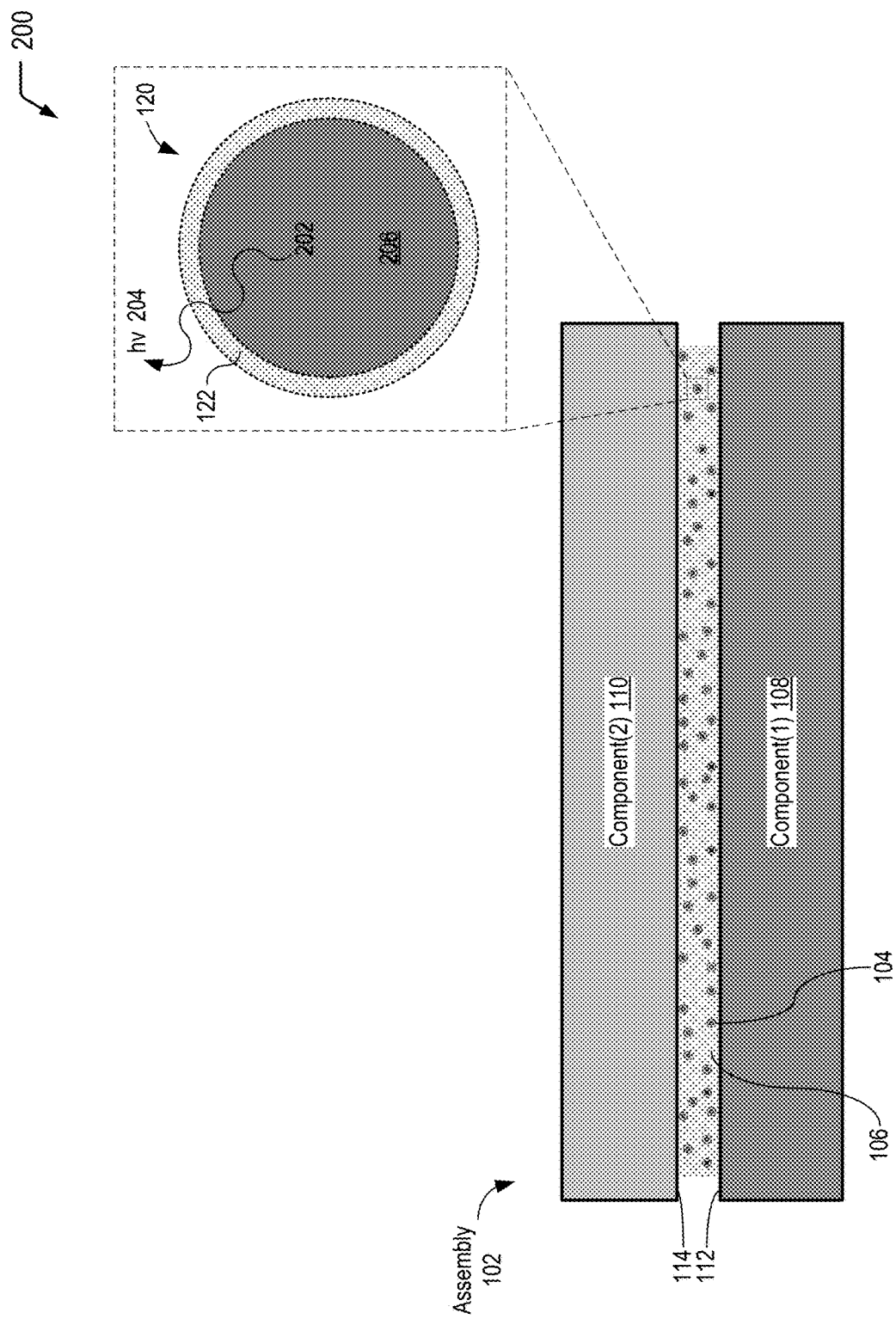
FIG. 2 is a diagram illustrating a cross-sectional view of the assembly depicted in FIG. 1 after application of the stimulus to cause the chemiluminescence reaction, according to one embodiment.

Referring to FIG. 2, a diagram 200 illustrates a cross-sectional view of the assembly 102 depicted in FIG. 1 after application of a particular stimulus to the microcapsules 104, according to one embodiment. FIG. 2 illustrates that application of the particular stimulus (e.g., a compressive force and optionally heat for the microcapsule design depicted in FIG. 1) results in a chemiluminescent reaction within the individual microcapsules 104.

In FIG. 2, an exploded cross-sectional view illustrates the individual microcapsule 120 of FIG. 1 after application of a particular compressive force to the microcapsules 104 dispersed in the interface material 106. FIG. 2 illustrates that application of the stimulus to the microcapsules 104 results in rupture of the capsule wall 128 of the inner microcapsule 124 depicted in FIG. 1 to allow the first reactant(s) 126 and the second reactant(s) 130 to mix and undergo a chemiluminescent reaction (identified by the reference character 202 in FIG. 2). FIG. 2 further illustrates that application of the particular compressive force does not result in rupture of the outer wall 122 of the microcapsule 120.

FIG. 2 illustrates that the chemiluminescent reaction 202 that occurs within the microcapsule 120 generates light 204 (identified as "hv" in FIG. 2), and the outer wall 122 of the microcapsule 120 allows a substantial portion of the light 204 (or particular curing wavelength(s) of the light 204) to pass through the outer wall 122 into the surrounding interface material 106. As described further herein, the light 204 is within a particular wavelength range that is satisfactory to trigger a particular photo-initiator to initiate or catalyze the curing of the photo-curable material in the interface material 106. FIG. 2 further illustrates that the microcapsule 120 may contain a reaction product 206 of the reaction of the first reactant(s) 126 and the second reactant(s) 130. As the outer wall 122 remains intact after application of the particular compressive force, the outer wall 122 may prevent the reaction product 206 from contacting the interface material 106.

Thus, FIG. 2 illustrates that application of a stimulus to the microcapsules causes a chemiluminescence reaction to occur within the microcapsules. FIG. 2 further illustrates that a substantial portion of the photons generated within the microcapsules may be transmitted into a surrounding material in order to trigger the photo-initiator that initiates or catalyzes the curing of a photo-curable material in the surrounding material.

Figure 3A:
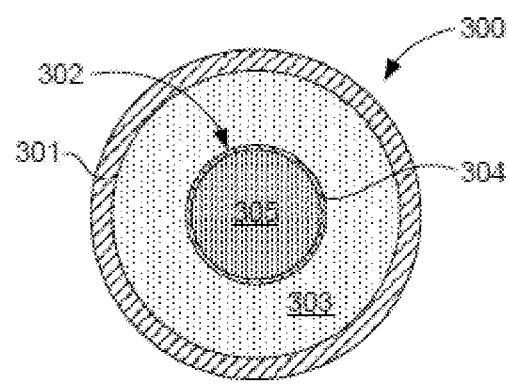
FIG. 3A is a diagram illustrating a multiple-compartment microcapsule having a shell-in-shell architecture with an inner shell contained within an outer shell, according to one embodiment. The inner shell is adapted to rupture in response to application of a compressive force in order to trigger a chemiluminescent reaction, according to one embodiment.

FIG. 3A is a diagram illustrating a cross-sectional view of a multiple-compartment microcapsule 300 having a shell-in-shell architecture with an inner shell contained within an outer shell, according to one embodiment. In FIG. 3A, the inner shell is adapted to rupture in response to application of a compressive force in order to trigger a chemiluminescent reaction within the microcapsule. In a particular embodiment, the multiple-compartment microcapsule 300 of FIG. 3A corresponds to the individual microcapsule 120 depicted in FIG. 1.

In FIG. 3A, the multi-compartment microcapsule 300 has an outer wall 301 (also referred to herein as the "outer shell" of the multi-compartment microcapsule 300) and contains an inner microcapsule 302 and a first reactant 303 (or a first set of multiple reactants). The inner microcapsule 302 has a capsule wall 304 (also referred to herein as the "inner shell" of the multi-compartment microcapsule 300) and contains a second reactant 305 (or a second set of multiple reactants). The first reactant(s) 303 within the multi-compartment microcapsule 300 may surround the inner microcapsule 302, and the first reactant(s) 303 may be prevented from contacting the second reactant(s) 305 by the capsule wall 304 of the inner microcapsule 302. The capsule wall 304 of the inner microcapsule 302 may be formed to rupture under a particular compressive force, and the outer wall 301 of the microcapsule 300 may be formed so as to not rupture under that compressive force. Rupturing the capsule wall 304 of the inner microcapsule 302 may allow the first reactant(s) 303 to contact the second reactant(s) 305 and the reactants may then undergo a chemiluminescent reaction.

Figure 3B:
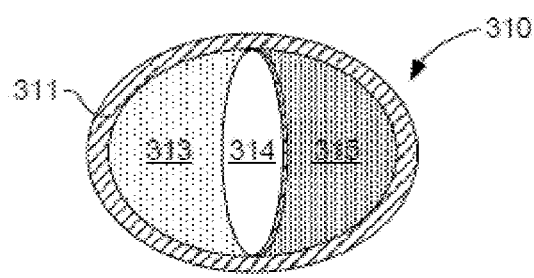
FIG. 3B is a diagram illustrating a multiple-compartment microcapsule having an inner barrier to form compartments, according to one embodiment. The inner barrier is adapted to rupture in response to application of a compressive force in order to trigger a chemiluminescent reaction, according to one embodiment.

FIG. 3B is a diagram illustrating a cross-sectional view of a multiple-compartment microcapsule 310 having an inner barrier to form compartments, according to one embodiment. In FIG. 3B, the inner barrier is adapted to rupture in response to application of a compressive force in order to trigger a chemiluminescent reaction within the microcapsule.

In FIG. 3B, the multi-compartment microcapsule 310 has an inner barrier that defines compartments, where the inner barrier is adapted to rupture in response to a compressive force according to some embodiments of the present disclosure. In FIG. 3B, the multi-compartment microcapsule 310 has an outer wall 311 and contains a first reactant 313 (or a first set of multiple reactants) and a second reactant 315 (or a second set of multiple reactants). An inner barrier 314, which may be a membrane, within the multi-compartment microcapsule 310 may prevent the first reactant(s) 313 and the second reactant(s) 315 from coming into contact. The inner barrier 314 may be any form of a physical barrier that forms two or more compartments within the microcapsule 310. The inner barrier 314 may be formed to rupture under a particular compressive force and the outer wall 311 of the multi-compartment microcapsule 310 may be formed so as to not rupture under that compressive force. Rupturing the inner barrier 314 may allow the first reactant(s) 313 to contact the second reactant(s) 315, and the reactants may then undergo a chemiluminescent reaction.

In some cases, the compressive force applied to the multiple-compartment microcapsules 300 and 310 depicted in FIGS. 3A and 3B may be within a range typical of that applied in the manufacture of adhesive, polymer, or thermal interface materials. In accordance with some embodiments, the inner capsule wall 304 (of the multiple-compartment microcapsule 300 shown in FIG. 3A), or the inner barrier 314 (of the multiple-compartment microcapsule 310 shown in FIG. 3B), may rupture at a force no greater than the lower bound of this range of compressive force. The outer wall 301 (of the multiple-compartment microcapsule 300 shown in FIG. 3A), or the outer wall 311 (of the multiple-compartment microcapsule 310 shown in FIG. 3B), may sustain, without rupturing, a force no less than the upper bound of this range of compressive force.

Other embodiments may utilize more than two reactants. The multi-compartment microcapsule 300 of FIG. 3A may contain a plurality of inner microcapsules, such as the inner microcapsule 302, and the inner microcapsules may themselves contain other, inner, microcapsules and/or reactants. The various microcapsules may contain reactants and may rupture under compression to allow the reactants to come into contact. Similarly, the multi-compartment microcapsule 310 of FIG. 3B may contain a plurality of compartments formed by a plurality of membranes or barriers, such as the barrier 314, and the compartments may in turn contain one or more membranes or barriers, or may contain microcapsules. The inner shells and outer shells may contain multiple chemicals, compounds, particles, and the like. The various membranes or barriers may rupture under compression to allow the reactants to come into contact.

Figure 4:
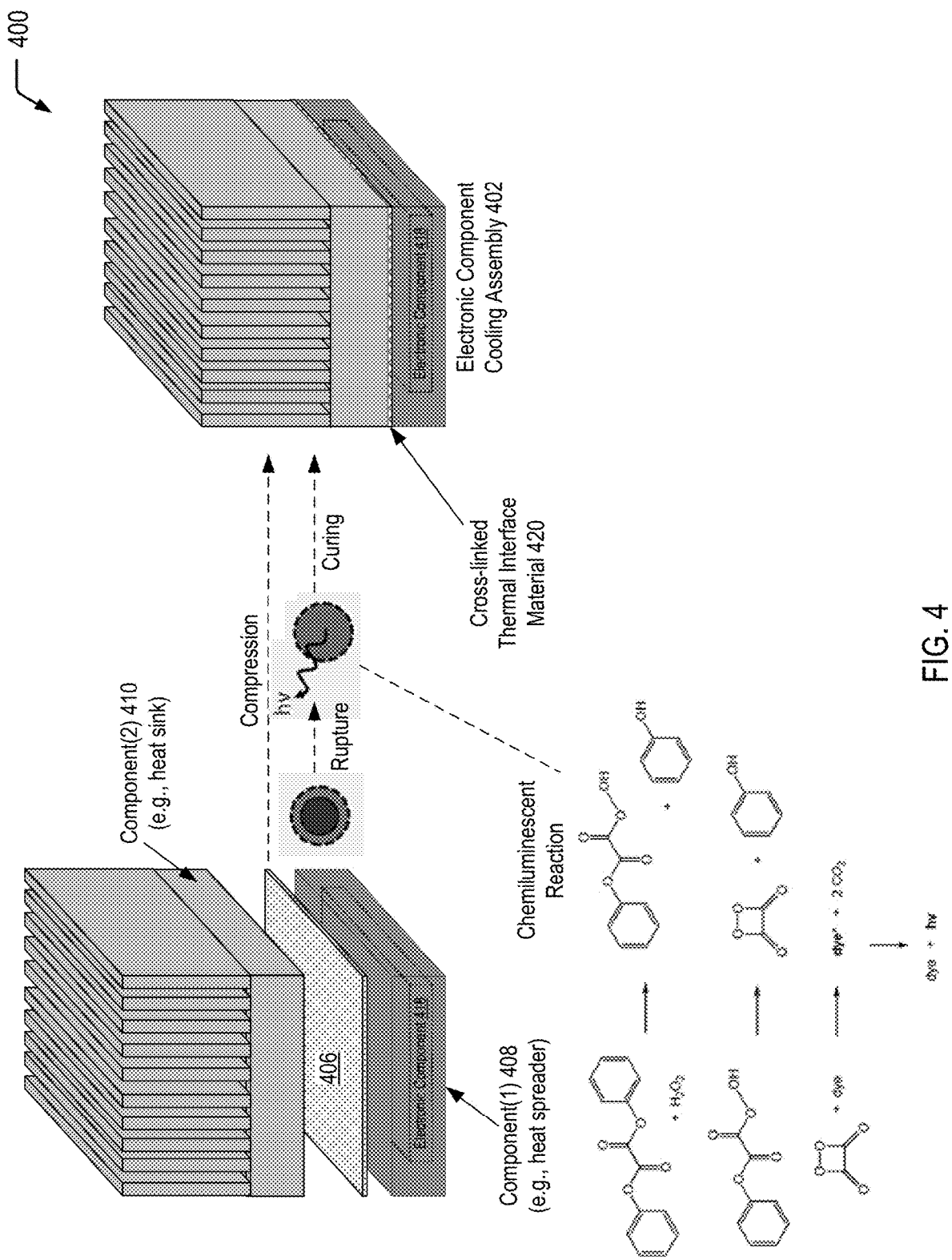
FIG. 4 is diagram illustrating a process of forming an electronic component cooling assembly having a cross-linked thermal interface material by applying a compressive force to an assembly including a thermal interface material disposed between a heat generating component and a heat dissipating component, according to one embodiment.

Referring to FIG. 4, a diagram 400 illustrates an example of a process of forming an electronic component cooling assembly 402 from an assembly that includes a thermal interface material 406 (e.g., a thermal grease or putty having light generating microcapsules dispersed therein) that defines an interface between a first component 408 and a second component 410.

In the particular embodiment depicted in FIG. 4, the first component 408 of the electronic component cooling assembly 402 corresponds to a heat spreader that surrounds an electronic component 418 and is configured to distribute heat away from the electronic component 418 during electronic device operation. To illustrate, the electronic component 418 may include a die, a central processing unit (CPU), a graphics processing unit (GPU), or a field programmable gate array (FPGA), among other alternatives. The heat spreader is also referred to herein as a module lid, and the electronic component 418 within the heat spreader is also referred to herein as a lidded module. The second component 410 of the electronic component cooling assembly 402 corresponds to a heat sink.

FIG. 4 illustrates that, during formation of the electronic component assembly 402, a compressive force is applied to the second component 410 and/or the first component 408 of the assembly. In a particular embodiment, the thermal interface material 406 of FIG. 4 corresponds to the interface material 106 of FIG. 1. Thus, while not shown in the example of FIG. 4, the thermal interface material 406 may include a photo-initiator, a photo-curable material, and the microcapsules 104 previously described herein with respect to FIG. 1. In FIG. 4, the compressive force that is applied to the thermal interface material 406 during formation of the electronic component assembly 402 results in rupture of the capsule wall 128 of the inner microcapsule 124, allowing the first reactant(s) 126 and the second reactant(s) 130 to undergo a chemiluminescent reaction. FIG. 4 further shows a non-limiting, illustrative example of a chemiluminescent reaction in order to show that the light emitted from the microcapsules 104 into the thermal interface material 406 results in the formation of a cross-linked thermal interface material 420 between the first component 408 and the second component 410 of the electronic component cooling assembly 402.

The chemical reaction diagram depicted at the bottom of FIG. 4 illustrates an example of a chemiluminescent reaction that occurs within the microcapsules 104 dispersed within the thermal interface material 406 as a result of application of the compressive force during formation of the electronic component cooling assembly 402.

The top portion of the chemical reaction diagram illustrates a diphenyl oxalate molecule reacting with a hydrogen peroxide molecule to form two phenol molecules and one 1,2-dioxetanedione molecule. The middle portion of the chemical reaction diagram illustrates that the 1,2-dioxetanedione molecule, having an unstable strained ring, decomposes spontaneously to carbon dioxide and releases energy that excites a dye (with the excited die identified as "dye*" in FIG. 4). The bottom portion of the chemical reaction diagram illustrates that the excited dye then releases a photon as it returns to its ground state, with "hv" representing the standard notation referring to release of radiant energy other than heat during the reaction.

The wavelength of the photon that is released as the excited dye returns to its ground state depends on the structure of a particular dye that is selected. To illustrate, different dyes may have different photon emission spectral distributions. Similarly, different photo-initiators may have different photo-initiator absorbance spectral distributions. A photon emission spectral distribution associated with a particular dye may be used to identify peak emission region(s), and the peak emission region(s) may be compared to a photo-initiator absorbance spectral distribution associated a particular photo-initiator to determine whether the particular photo-initiator is sufficiently absorbent in the peak emission region(s). As such, a particular combination of a dye and a photo-initiator may be selected such that a wavelength of a photon emitted when the excited dye returns to its original state is satisfactory to trigger the photo-initiator within the thermal interface material 406 to initiate or catalyze the curing of the photo-curable material. In some cases, the emission peak(s) in a photon emission spectral distribution associated with a particular dye may be compared to a spectral distribution associated with a light source (e.g., a mercury arc lamp) that is typically utilized to photo-cure a polymer/adhesive. A photo-initiator (or multiple photo-initiators) may be identified as satisfactory for the individual emission peaks in the spectral distribution associated with the light source.

As an illustrative, non-limiting example, the dye may be 9,10-diphenylanthracene which has a marked emission peak at 405 nm and appreciable emission at 436 nm. In this case, an illustrative, non-limiting example of a photo-initiator with a satisfactory photo-initiator absorbance spectral distribution is Ciba® IRGACURE™ 784 from Ciba Specialty Chemicals Inc. It will be appreciated that numerous combinations of dyes and photo-initiators may be suitable to cure a particular photo-curable material.

Thus, FIG. 4 illustrates an example of a process of forming an electronic component cooling assembly having a cross-linked thermal interface material by applying a compressive force to an assembly including a thermal interface material (having light generating microcapsules dispersed therein) disposed between a heat spreader and a heat sink. FIG. 4 illustrates that application of the compressive force to the microcapsules dispersed within the thermal interface material causes a chemiluminescent reaction with a photon emission wavelength that is satisfactory to form the cross-linked thermal interface material.

Figure 5:
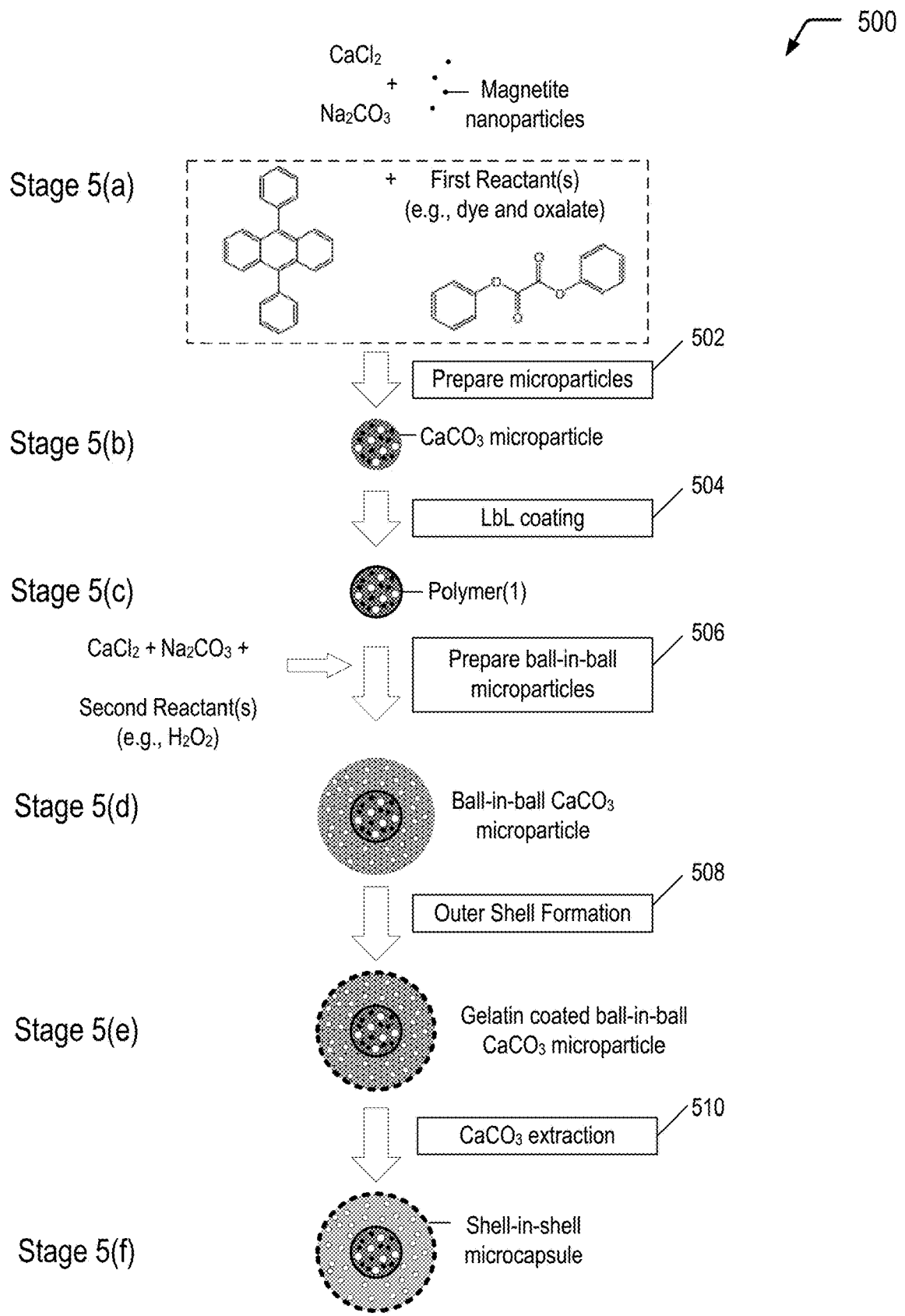
FIG. 5 is a flow diagram illustrating a method of producing a multiple-compartment microcapsule having a shell-in-shell architecture with an inner shell contained within an outer shell, where the inner shell is adapted to rupture in response to application of a compressive force to cause a chemiluminescent reaction within the microcapsule, according to some embodiments.

FIG. 5 is a flow diagram illustrating, through stages 5(a) to 5(f), an example of a method 500 of producing a multiple-compartment microcapsule having a shell-in-shell architecture with an inner shell contained within an outer shell, where the inner shell is adapted to rupture in response to application of a compressive force to cause a chemiluminescent reaction within the microcapsule, according to some embodiments.

In each of the stages 5(a)-5(f), the structure is shown in a cross-sectional side view. Referring to FIG. 5, and according to an embodiment, the shell-in-shell microcapsules can be made using any reactants and oxidants of any chemiluminescent reaction (identified as "First Reactant(s)" and "Second Reactant(s)" in FIG. 5). For example, First Reactant(s) may be a dye and diphenyl oxalate, and Second Reactant(s) may be an oxidant such as hydrogen peroxide. Once the inner shell ruptures, the reactants mix and emit photons. One skilled in the art will understand that a variety of chemiluminescent reactants can be used. Both the First Reactant(s) and the Second Reactant(s) may comprise one or more chemicals, particles, and combinations thereof.

In the example depicted in FIG. 5, magnetic nanoparticles are used in operation 502 for incorporation into the "inner core" $CaCO_3$ microparticles (shown at stage 5(b)). Magnetic nanoparticles are incorporated into the "inner core" $CaCO_3$ microparticles for the purpose of subsequently magnetically isolating the product prepared in operation 506 (i.e., ball-in-ball $CaCO_3$ microparticles) from a coproduct (i.e., single core $CaCO_3$ microparticles). The magnetic nanoparticles may be, for example, $Fe_3O_4$ (also referred to as "magnetite") nanoparticles, cobalt ferrite nanoparticles or other magnetic nanoparticles known in the art. In a particular embodiment, the magnetic nanoparticles may have a diameter in a range of approximately 6 nm to 25 nm.

An example of a technique of preparing magnetite nanoparticles follows. A 5 mol/l NaOH solution is added into a mixed solution of 0.25 mol/l ferrous chloride and 0.5 mol/l ferric chloride (molar ratio 1:2) until obtaining pH 11 at room temperature. The slurry is washed repeatedly with distilled water. Then, the resulting magnetite nanoparticles are magnetically separated from the supernatant and redispersed in aqueous solution at least three times, until obtaining pH 7. A typical average diameter of the resulting magnetite nanoparticles may be about 12 nm.

The microparticle system described with respect to FIG. 5 is based on $CaCO_3$ microparticles that are hardened by formation of a polyelectrolyte multilayer around the $CaCO_3$ microparticles. The method 500 begins by preparing spherical calcium carbonate microparticles in which magnetite nanoparticles and First Reactant(s) (e.g., diphenyl oxalate and a dye, such as 9,10-diphenylanthracene) are immobilized by coprecipitation (operation 502). For example, 1 M $CaCl_2$ (0.615 mL), 1 M $Na_2CO_3$ (0.615 mL), 1.4% (w/v) magnetite nanoparticle suspension (50 µL), First Reactant(s) (0.50 mg dye and 133 mg oxalate), and deionized water (2.450 mL) may be rapidly mixed and thoroughly agitated on a magnetic stirrer for about 20 seconds at about room temperature. After the agitation, the precipitate may be separated from the supernatant by centrifugation and washed three times with water. The diameter of the $CaCO_3$ microparticles produced with a reaction time of 20 seconds is about 4 µm to about 6 µm. Smaller $CaCO_3$ microparticles are produced if the reaction time is reduced from about 20 seconds to about several seconds. One of the resulting $CaCO_3$ microparticles is shown at stage 8(b).

In this example, the fabrication of polyelectrolyte capsules is based on the layer-by-layer (LbL) self-assembly of polyelectrolyte thin films. Such polyelectrolyte capsules are fabricated by the consecutive adsorption of alternating layer of positively and negatively charged polyelectrolytes onto sacrificial colloidal templates. Calcium carbonate is but one example of a sacrificial colloidal template. One skilled in the art will appreciate that other templates may be used in lieu of, or in addition to, calcium carbonate.

The method 500 continues by LbL coating the $CaCO_3$ microparticles (operation 504). In operation 504, a polyelectrolyte multilayer (PEM) build-up may be employed by adsorbing five bilayers of negative PSS (poly(sodium 4-styrenesulfonate); Mw=70 kDa) and positive PAH (poly(allylamine hydrochloride); Mw=70 kDa) (2 mg/mL in 0.5 M NaCl) by using the layer-by-layer assembly protocol. For example, the $CaCO_3$ microparticles produced in operation 502 may be dispersed in a 0.5 M NaCl solution with 2 mg/mL PSS (i.e., polyanion) and shaken continuously for 10 min. The excess polyanion may be removed by centrifugation and washing with deionized water. Then, 1 mL of 0.5 M NaCl solution containing 2 mg/mL PAH (i.e., polycation) may be added and shaken continuously for 10 min. The excess polycation may be removed by centrifugation and washing with deionized water. This deposition process of oppositely charged polyelectrolyte may be repeated five times and, consequently, five PSS/PAH bilayers are deposited on the surface of the $CaCO_3$ microparticles. One of the resulting polymer coated $CaCO_3$ microparticles is shown at stage 5(c).

The thickness of this "inner shell" polyelectrolyte multilayer may be varied by changing the number of bilayers. Generally, it is desirable for the inner shell to rupture while the outer shell remains intact so that the reactants and the reaction products do not contaminate the interface material (e.g., an adhesive, a thermal interface material, etc.) into which the multi-compartment microcapsule may be dispersed. Typically, for a given shell diameter, thinner shells rupture more readily than thicker shells. Hence, in accordance with some embodiments of the present disclosure, the inner shell is made relatively thin compared to the outer shell. On the other hand, the inner shell must not be so thin as to rupture prematurely.

The PSS/PAH-multilayer in operation 504 is but one example of a polyelectrolyte multilayer. One skilled in the art will appreciate that other polyelectrolyte multilayers and other coatings may be used in lieu of, or in addition to, the PSS/PAH-multilayer in operation 504.

The method 500 continues by preparing ball-in-ball calcium carbonate microparticles in which Second Reactant(s) (which can be any suitable oxidant, including hydrogen peroxide) is immobilized by a second coprecipitation (operation 506). "Immobilize" means "removing from general circulation, for example by enclosing in a capsule." The ball-in-ball $CaCO_3$ microparticles are characterized by a polyelectrolyte multilayer that is sandwiched between two calcium carbonate compartments. In operation 506, the polymer coated $CaCO_3$ microparticles may be resuspended in 1M $CaCl_2$ (0.615 mL), 1M $Na_2CO_3$ (0.615 mL), and deionized water (2.500 mL) containing hydrogen peroxide (1 mg), rapidly mixed and thoroughly agitated on a magnetic stirrer for about 20 seconds at about room temperature. After the agitation, the precipitate may be separated from the supernatant by centrifugation and washed three times with water. The second coprecipitation is accompanied by formation of a coproduct, i.e., single core $CaCO_3$ microparticles that contain only hydrogen peroxide. Hence, the resulting precipitate represents a mixture of ball-in-ball $CaCO_3$ microparticles and single core $CaCO_3$ microparticles. The ball-in-ball $CaCO_3$ microparticles, which are magnetic due to the immobilized magnetite nanoparticles in the inner compartment, may be isolated by applying an external magnetic field to the sample while all of the nonmagnetic single core $CaCO_3$ microparticles are removed by a few washing steps. One of the resulting ball-in-ball $CaCO_3$ microparticles is shown at stage 5(*d*).

In an embodiment, the outer shell wall material is made of a material for the chemiluminescent photon to escape the shell. In another embodiment, the outer shell wall material is made of a material where the photon yield outside the wall of the outer shell wall is maximized. In an embodiment, the outer shell wall has a transmittance of at least 90%. In certain embodiments, the outer shell wall material may include natural polymeric material, such as gelatin, arabic gum, shellac, lac, starch, dextrin, wax, rosin, sodium alginate, zein, and the like; semi-synthetic polymer material, such as methyl cellulose, ethyl cellulose, carboxymethyl cellulose, hydroxyethyl ethyl cellulose; full-synthetic polymer material, such as polyolefins, polystyrenes, polyethers, polyureas, polyethylene glycol, polyamide, polyurethane, polyacrylate, epoxy resins, among others. In certain embodiments, the method for wrapping a core material includes chemical methods such as interfacial polymerization, in situ polymerization, molecular encapsulation, radiation encapsulation; physicochemical methods such as aqueous phase separation, oil phase separation, capsule-heart exchange, pressing, piercing, powder bed method; and physical methods, such as spray drying, spray freezing, air suspension, vacuum evaporation deposition, complex coacervation, long and short centrifugation.

An example of a conventional technique of preparing the outer shell follows, and can be accomplished at stage 5(*e*). A gelatin is dissolved into n-hexane in a water bath at about 50° C. to obtain a 6% gelatin solution. The gelatin may optionally be swelled with deionized water before the preparation of the gelatin solution. The ball-in-ball $CaCO_3$ microparticles prepared in operation 506 are added to the gelatin solution while stirring to form an emulsified dispersion system. The pH is then adjusted to about 3.5-3.8 using acetic acid, and then a 20% sodium sulfate solution is slowly added into the dispersion system while maintaining a temperature of about 50° C. The temperature of the dispersion system is then lowered to a temperature of about 15° C. The result is a colloid of gelatin coated ball-in-ball $CaCO_3$ microparticles.

Generally, it is desirable for the inner shell to rupture while the outer shell remains intact so that the reactants and the reaction products do not contaminate the sealant or adhesive into which the multi-compartment microcapsule is dispersed. Typically, for a given shell diameter, thinner shells rupture more readily than thicker shells. Hence, in accordance with some embodiments of the present disclosure, the outer shell is made relatively thick compared to the inner shell.

Operation 510 is a $CaCO_3$ extraction. In operation 510, the $CaCO_3$ core of the ball-in-ball $CaCO_3$ microparticles may be removed by complexation with ethylenediaminetetraacetic acid (EDTA) (0.2 M, pH 7.5) leading to formation of shell-in-shell microcapsules. For example, the gelatin coated ball-in-ball $CaCO_3$ microparticles produced in operation 508 may be dispersed in 10 mL of the EDTA solution (0.2 M, pH 7.5) and shaken for about 4 h, followed by centrifugation and re-dispersion in fresh EDTA solution. This core-removing process may be repeated several times to completely remove the $CaCO_3$ core. The size of the resulting shell-in-shell microcapsules ranges from about 8 μm to about 10 μm, and the inner core diameter ranges from about 3 μm to about 5 μm. One of the resulting shell-in-shell microcapsules is shown at stage 5(*f*). Depending on the application of use, the shell-in-shell microcapsule can have a range of about 0.5 μm to about 200 μm.

As noted above, the fabrication of polyelectrolyte capsules in the method 500 of FIG. 5 is based on the layer-by-layer (LbL) self-assembly of polyelectrolyte thin films. One skilled in the art will appreciate that a multi-compartment microcapsule for photon generation in accordance with some embodiments of the present disclosure may be produced by other conventional multi-compartment systems, such as polymeric micelles, hybrid polymer microspheres, and two-compartment vesicles.

As noted above, one skilled in the art will understand that various chemiluminescent reactants and oxidants can be used. Moreover, the multi-compartment microcapsule can utilize various chemiluminescent reactions. The chemistry used in chemiluminescent reactions is a mature technology, and those skilled in the art will know that additional materials can be further added to the multi-compartment microcapsule. For example, enhancing reagents such as alkyl dimethyl benzyl quaternary ammonium salt may be added to the reactants.

While the method 500 of FIG. 5 illustrates formation of shell-in-shell microcapsules where the inner shell is adapted to rupture in response to a compressive force, the inner shell can be adapted to rupture in response to other forms of stimuli including heat and ultrasound.

Other embodiments may utilize more than two reactants. For example, the multi-compartment microcapsule 300 of FIG. 3A may contain a plurality of inner microcapsules, such as 304, and the inner microcapsules may themselves contain other, inner, microcapsules. The various microcapsules may contain reactants and may rupture under compression to allow the reactants to come into contact. Similarly, the multi-compartment microcapsule 310 of FIG. 3B may contain a plurality of compartments formed by a plurality of membranes or barriers, such as 314, and the compartments may in turn contain one or more membranes or barriers, or may contain microcapsules. The various membranes or barriers may rupture under compression to allow the reactants to come into contact. For example, one inner shell microcapsule contains reactants (A), and second inner microcapsule contains reactants (B), and the outer shell microcapsule contains reactants (C). Depending on the strength of the stimuli (i.e., compression), inner shell containing reactants (A) will rupture, while inner shell containing reactants (B) will not rupture.

Other embodiments may utilize more than one multi-compartment microcapsule, where the individual multi-compartment microcapsules have different strengths in response to a stimulus (e.g., compressive force, a magnetic field, ultrasound, heat, or combinations thereof). For example, one multi-compartment microcapsule may have an inner shell containing reactants (A), and the outer shell containing reactants (B). The other multi-compartment microcapsule may have an inner shell containing reactants (C) and the outer shell containing reactants (D). In this embodiment, multiple emission bands can be achieved depending on the strength of the applied stimulus. Emission 1 would comprise the chemiluminescent reaction of reactants (A) and (B) after a stimuli ruptures the inner shell of one microcapsule, while emission 2 would comprise the chemiluminescent reaction of (C) and (D) after a stimuli ruptures the inner shell of the other microcapsule.

The photon-emitting reactants may be chosen to be inert with respect to the material of the microcapsule walls, or an isolating barrier within a microcapsule when the reactants are not in contact. The photon-emitting reactants also may be chosen to be inert with respect to the outer microcapsule wall when the reactants are in contact, or such that the chemical products of the reaction are inert with respect to the outer microcapsule wall, and any remnants of the inner microcapsule wall or barrier.

An amount of the first reactant and an amount of the second reactant may be determined. The amounts may be determined from the total amount of the reactants required to produce a desired amount of photons, the ratio of each reactant according to a reaction equation, the desired dimensions of the microcapsule, and the manner of isolating the reactants within the capsule. For example, a microcapsule may be desired having a maximum dimension less than or equal to a desired final thickness of less than 0.5 microns, and the amount of reactants may be chosen corresponding to the volume available within a microcapsule formed according to that dimension.

One or more inner microcapsules, such as illustrated by microcapsule 300 of FIG. 3A, may be formed and the inner microcapsules may contain second reactant(s). In various embodiments, an inner microcapsule may be formed to contain chemiluminescent reactants (including dye, oxalates, other reactants described herein, and combinations thereof). The inner microcapsule(s) may be formed with a capsule wall configured to rupture with application of a compressive force.

Further, an outer microcapsule may be formed containing the inner microcapsule(s) and one or more other reactants, in the manner of multi-compartment microcapsule 300 in FIG. 3A. The reactant(s) contained in the outer microcapsule may be inert with respect to each other and the microcapsule walls until in contact with one or more reactants contained in one or more inner microcapsules. In one embodiment, an outer microcapsule may contain hydrogen peroxide, or other oxidizers, where one or more inner microcapsules contain chemiluminescent reactants (including dye, oxalates, etc.). The capsule wall of the outer microcapsule may be formed to not rupture at the compressive force applied to rupture the capsule wall of the inner microcapsule.

Alternatively, an embodiment may utilize a microcapsule having a structure as illustrated by the multi-compartment microcapsule 310 in FIG. 3B. In accordance with this alternative embodiment, an outer microcapsule may be formed having one or more inner barriers 314, which may be membranes, in the manner of the multi-compartment microcapsule 310 in FIG. 3B, forming two (or more) compartments within the outer microcapsule. The particular reactants described above may be contained within the compartments, and the inner barrier(s) may be formed to rupture at compressive forces such as described above with respect to the capsule wall of an inner microcapsule.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A process of curing a photo-curable material, the process comprising:
    dispersing a microcapsule in a material that includes a photo-initiator and a photo-curable material; and
    applying a stimulus to the microcapsule to trigger a chemiluminescent reaction within the microcapsule, the chemiluminescent reaction generating a photon having a wavelength within a particular emission range that is consistent with an absorption range of the photo-initiator,
    wherein the photon exits the microcapsule to trigger the photo-initiator to initiate or catalyze curing of the photo-curable material.

2. The process of claim 1, wherein the chemiluminescent reaction includes excitation of a dye from a ground state to an excited state and subsequent release of the photon upon relaxation from the excited state to the ground state.

3. The process of claim 2, wherein excitation of the dye is caused by energy released during decomposition of a 1,2-dioxetanedione molecule.

4. The process of claim 3, wherein a chemical reaction of a diphenyl oxalate molecule with a hydrogen peroxide molecule results in formation of the 1,2-dioxetanedione molecule.

5. The process of claim 2, wherein the dye includes 9,10-diphenylanthracene.

6. The process of claim 1, wherein the microcapsule includes a multiple-compartment microcapsule that comprises:
    a first compartment that contains a first reactant;
    a second compartment that contains a second reactant; and
    an isolating structure separating the first compartment from the second compartment, the isolating structure adapted to rupture in response to the stimulus to cause the first reactant and the second reactant to undergo the chemiluminescent reaction.

7. The process of claim 6, wherein the multiple-compartment microcapsule incudes a shell-in-shell microcapsule comprising an inner shell contained within an outer shell, wherein the inner shell encapsulates the first compartment, wherein the outer shell encapsulates the second compartment, and wherein the inner shell defines the isolating structure.

8. The process of claim 7, wherein the outer shell comprises a polymer, and the outer shell has a transmittance value of at least 90% for the wavelength within the particular emission range.

9. The process of claim 8, wherein the polymer comprises gelatin, arabic gum, shellac, lac, starch, dextrin, wax, rosin, sodium alginate, zein, methyl cellulose, ethyl cellulose, carboxymethyl cellulose, hydroxyethyl ethyl cellulose, polyolefins, polystyrenes, polyethers, polyesters, polyureas, polyethylene glycol, polyamides, polyimides, urea-formaldehydes, polyurethane, polyacrylate, epoxy resins, and combinations thereof.

10. The process of claim 1, further comprising:
disposing the material between a first component and a second component to form an assembly; and
applying the stimulus to the microcapsule by applying a compressive force to the assembly.

11. The process of claim 10, wherein:
the material includes a thermal interface material;
the first component includes a heat spreader surrounding an electronic component that generates heat during operation;
the second component includes a heat sink; and
compression of the assembly results in formation of an electronic component cooling assembly having a cross-linked thermal interface material disposed between the heat spreader and the heat sink.

12. The process of claim 1, wherein the material includes a thermal interface material or an adhesive.

13. An in-situ photo-curing process comprising:
forming an assembly that includes a material disposed between a first component and a second component, the material including a photo-initiator, a photo-curable material, and microcapsules dispersed therein; and
applying a stimulus to the assembly, wherein the stimulus triggers chemiluminescent reactions within the microcapsules, the chemiluminescent reactions generating photons having wavelengths within a particular emission range that is consistent with an absorption range of the photo-initiator,
wherein the photons exit the microcapsules for in-situ curing of the photo-curable material.

14. The in-situ photo-curing process of claim 13, wherein:
the material includes a thermal interface material;
the first component includes a heat spreader surrounding an electronic component that generates heat during operation;
the second component includes a heat sink; and
compression of the assembly results in formation of an electronic component cooling assembly having a cross-linked thermal interface material disposed between the heat spreader and the heat sink.

15. The in-situ photo-curing process of claim 14, further comprising forming the thermal interface material by dispersing the microcapsules in a thermal grease or putty.

16. The in-situ photo-curing process of claim 13, wherein the microcapsules include an outer wall having a transmittance value of at least 90% for the wavelengths within the particular emission range.

17. A material comprising:
a photo-initiator;
a photo-curable material;
a microcapsule that includes:
a first compartment that contains a first reactant;
a second compartment that contains a second reactant; and
an isolating structure separating the first compartment from the second compartment, the isolating structure adapted to rupture in response to application of a stimulus to cause the first reactant and the second reactant to undergo a chemiluminescent reaction,
wherein the chemiluminescent reaction generates a photon having a wavelength within a particular emission range that is consistent with an absorption range of the photo-initiator, and
wherein the photon exits the microcapsule to trigger the photo-initiator to initiate or catalyze curing of the photo-curable material.

18. The material of claim 17, wherein the microcapsule further comprises an outer shell and wherein the outer shell has a transmittance value of at least 90% for the wavelength within the particular emission range.

19. The material of claim 18, wherein the outer shell comprises gelatin, arabic gum, shellac, lac, starch, dextrin, wax, rosin, sodium alginate, zein, methyl cellulose, ethyl cellulose, carboxymethyl cellulose, hydroxyethyl ethyl cellulose, polyolefins, polystyrenes, polyethers, polyesters, polyureas, polyethylene glycol, polyamides, polyimides, urea-formaldehydes, polyurethane, polyacrylate, epoxy resins, and combinations thereof.

20. The material of claim 17, wherein the stimulus includes a compressive force, heat, or a combination thereof.

* * * * *